(12) United States Patent
Choi

(10) Patent No.: US 10,800,157 B2
(45) Date of Patent: Oct. 13, 2020

(54) PRINTING SCREEN FRAME HOLDING DEVICE

(71) Applicant: VONTRONICS CO., LTD., Anyang (KR)

(72) Inventor: Soon-Von Choi, Gunpo (KR)

(73) Assignee: VONTRONICS CO., LTD., Anyang (KR)

( * ) Notice: Subject to any disclaimer, the term of this patent is extended or adjusted under 35 U.S.C. 154(b) by 95 days.

(21) Appl. No.: 16/096,636

(22) PCT Filed: Dec. 23, 2016

(86) PCT No.: PCT/KR2016/015220
§ 371 (c)(1),
(2) Date: Oct. 25, 2018

(87) PCT Pub. No.: WO2017/188555
PCT Pub. Date: Nov. 2, 2017

(65) Prior Publication Data
US 2019/0152216 A1    May 23, 2019

(30) Foreign Application Priority Data
Apr. 28, 2016  (KR) .................. 10-2016-0052257

(51) Int. Cl.
*B41F 15/36*        (2006.01)
*B41C 1/14*         (2006.01)
*H01L 21/48*        (2006.01)

(52) U.S. Cl.
CPC ............... *B41F 15/36* (2013.01); *B41C 1/14* (2013.01); *H01L 21/48* (2013.01); *B41P 2215/50* (2013.01)

(58) Field of Classification Search
CPC ...... B41F 15/36; B41F 15/08; B41F 15/0813; B41F 15/0845; B41F 15/34; B41M 1/12; B41N 1/248; H05K 3/1216; H05K 3/1225; H05K 3/1233
USPC .................................. 101/127, 127.1, 128.1
See application file for complete search history.

(56) References Cited

U.S. PATENT DOCUMENTS

| 5,979,313 | A | * | 11/1999 | Fromm | .................. | B41F 15/36 101/127.1 |
| 6,038,969 | A | * | 3/2000 | Podlipec | ................. | B41F 15/36 101/127 |
| 7,077,908 | B2 | | 7/2006 | Nogiwa et al. | | |
| 8,430,027 | B2 | | 4/2013 | Shaw et al. | | |

(Continued)

FOREIGN PATENT DOCUMENTS

| EP | 2902199 B1 | 1/2018 |
| KR | 20110055475 A | 5/2011 |
| KR | 20140035158 A | 3/2014 |

(Continued)

*Primary Examiner* — Leslie J Evanisko
(74) *Attorney, Agent, or Firm* — Dorsey & Whitney LLP

(57) ABSTRACT

A printing screen frame holding device is provided. The printing screen frame holding device has a tensioning operation portion and an elevating operation portion, which are operated successively at an interval of few seconds by means of control of a rate of supply of air pressure by an orifice, are mounted on a quadrangular frame-shaped frame holding means that includes a combination of multiple mounting frames and multiple corner pieces, without provision of any separate mechanism or an additional component.

6 Claims, 11 Drawing Sheets

(56) References Cited

U.S. PATENT DOCUMENTS 8,904,929 B2 * 12/2014 Hall .................. B41C 1/14
                                                                                          101/127.1

FOREIGN PATENT DOCUMENTS

| KR | 20150131494 A | 11/2015 |
| --- | --- | --- |
| WO | 9703833 A1 | 2/1997 |
| WO | 2015177174 A2 | 11/2015 |
| WO | 2016059227 A1 | 4/2016 |

* cited by examiner

[FIG. 1] (PRIOR ART)
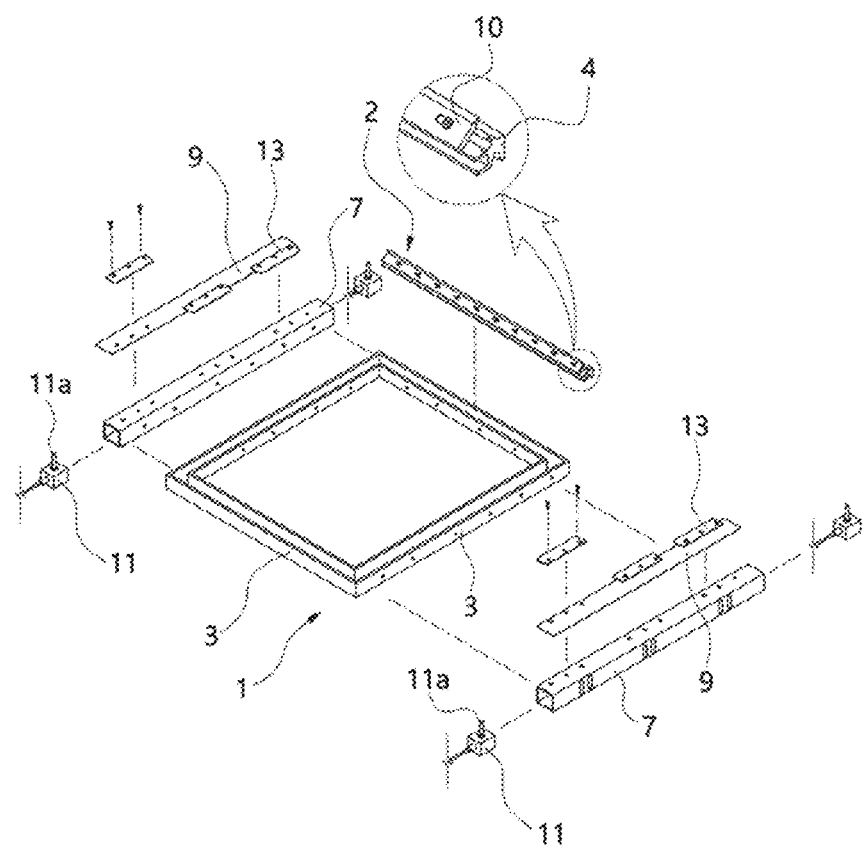

[FIG. 2]
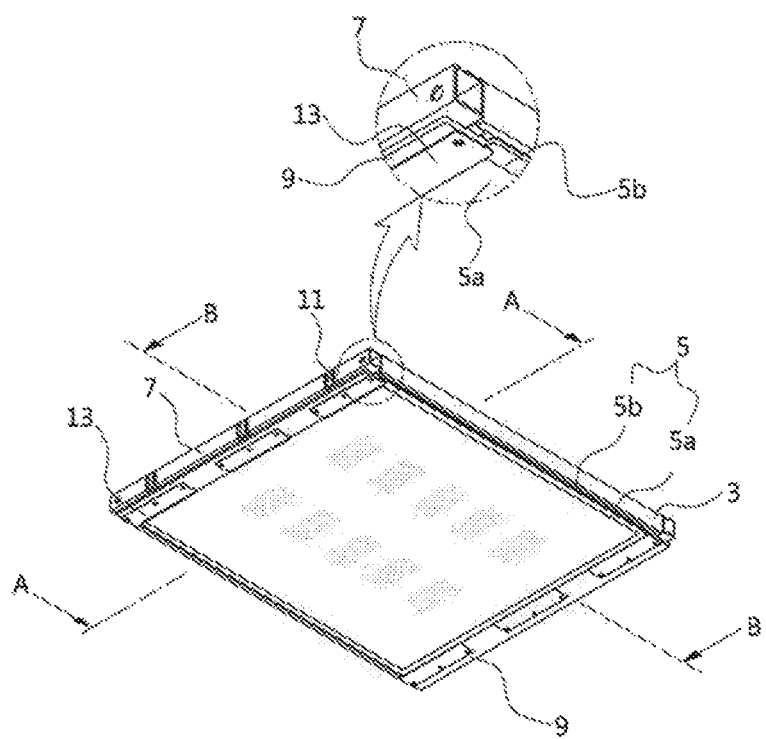

[FIG. 3A] (PRIOR ART)
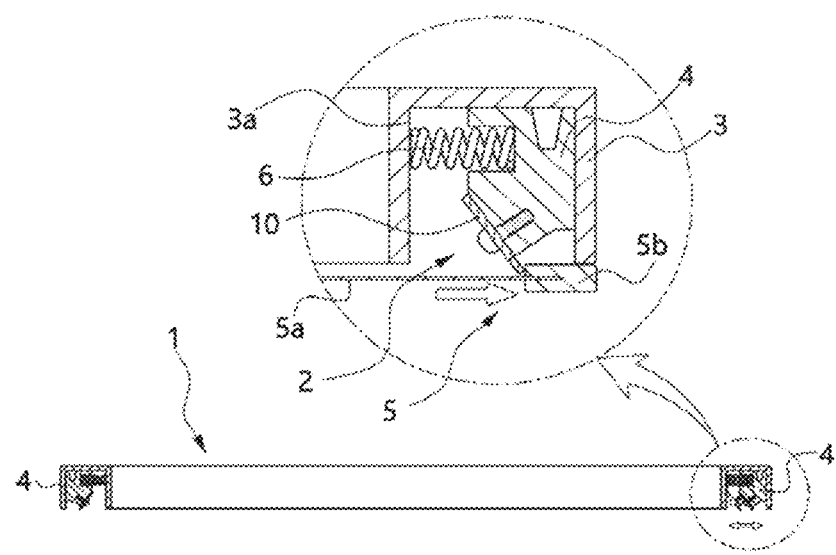
[FIG. 3B] (PRIOR ART)
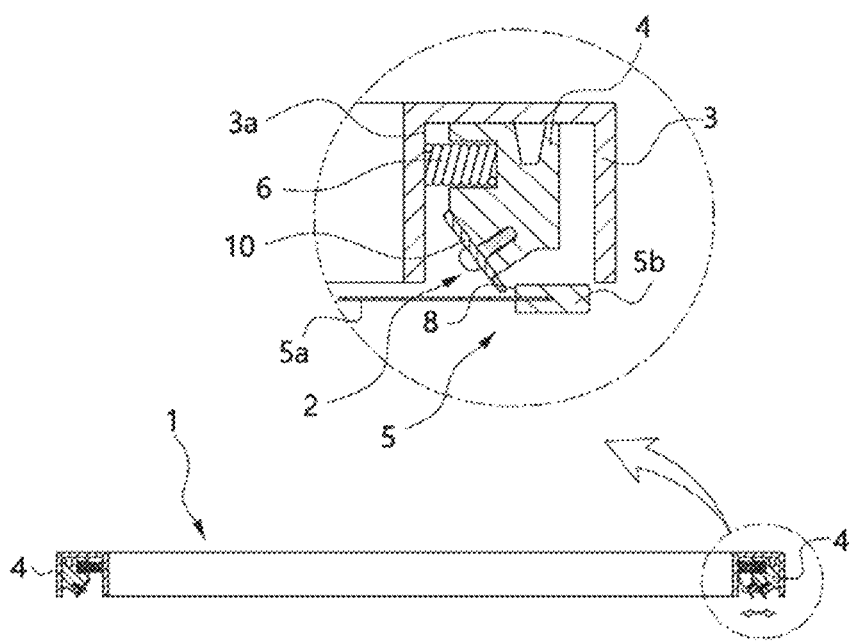

[FIG. 4A] (PRIOR ART)
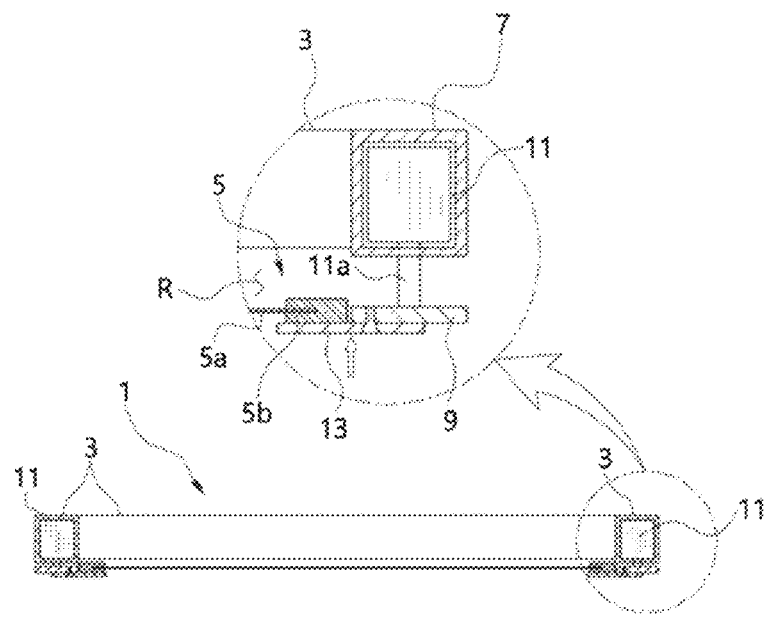
[FIG. 4B] (PRIOR ART)
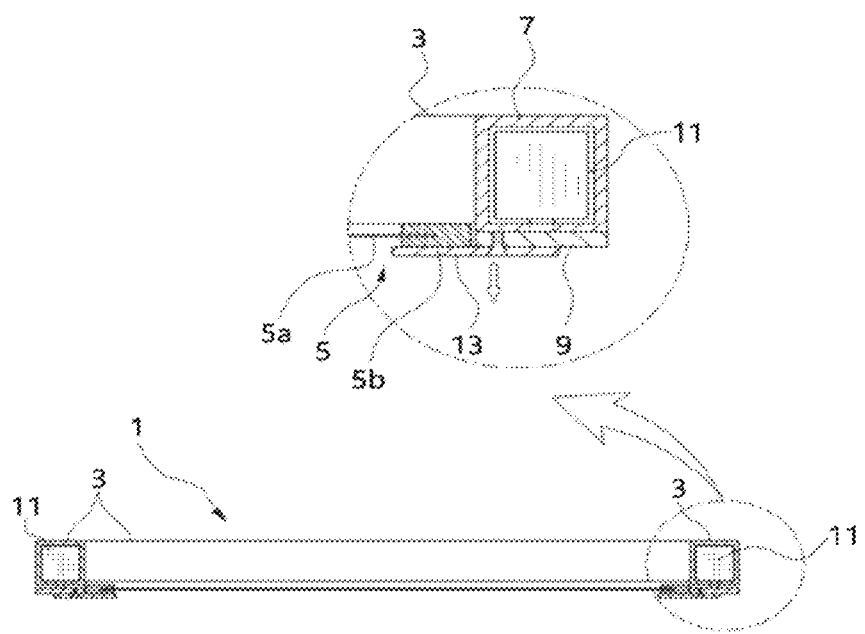

[FIG.5]
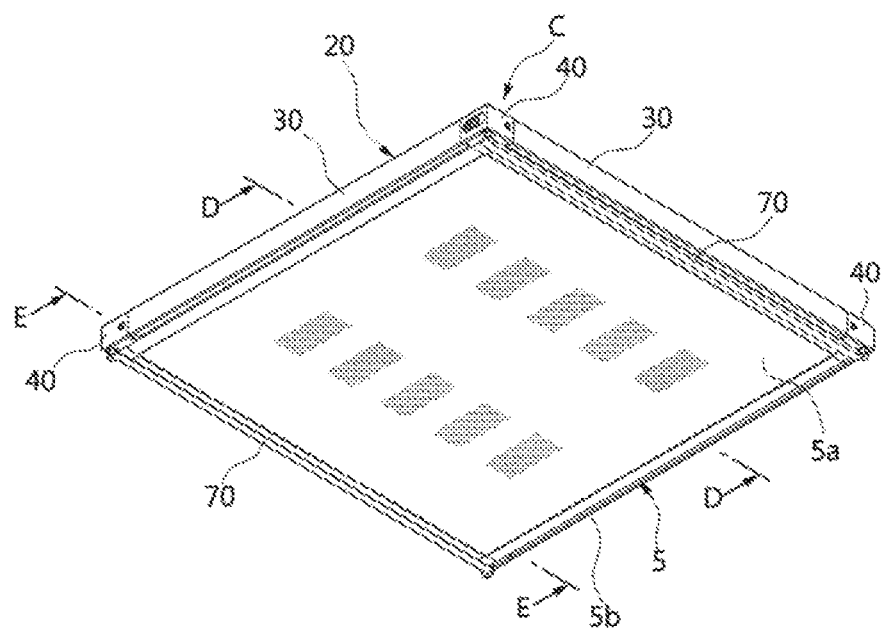

[FIG. 6]
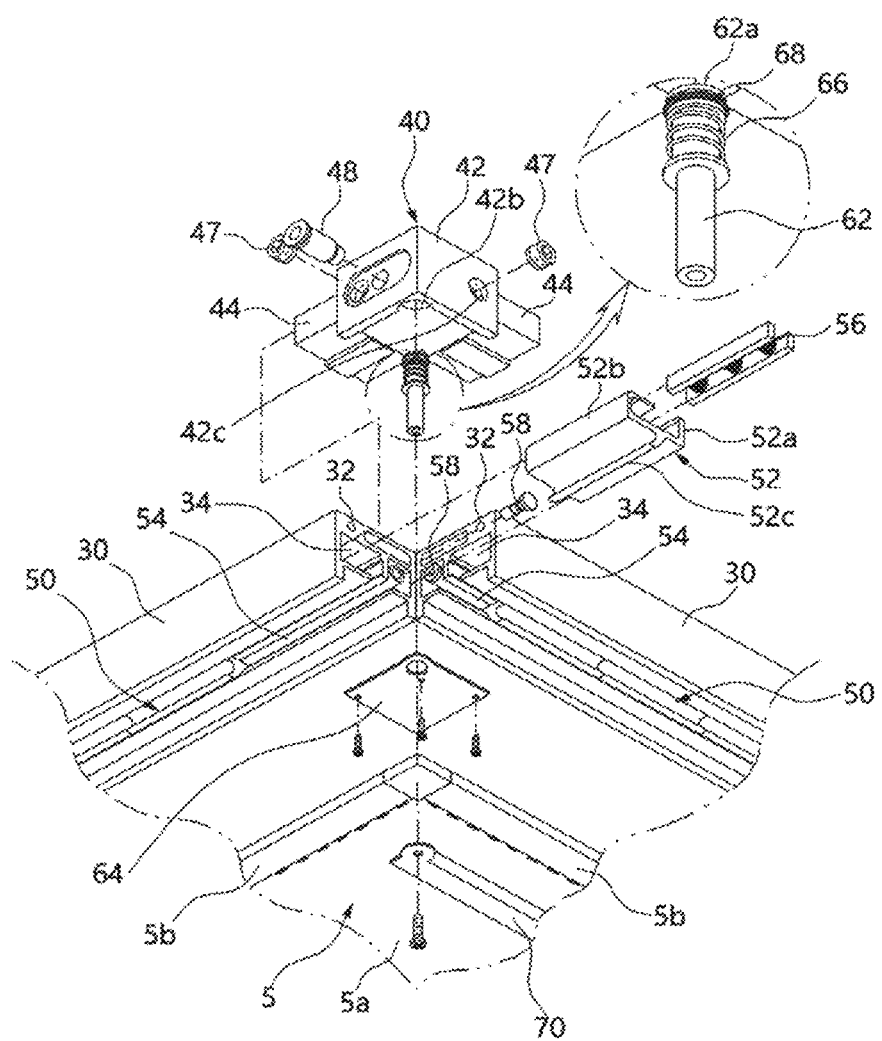

[FIG. 7]
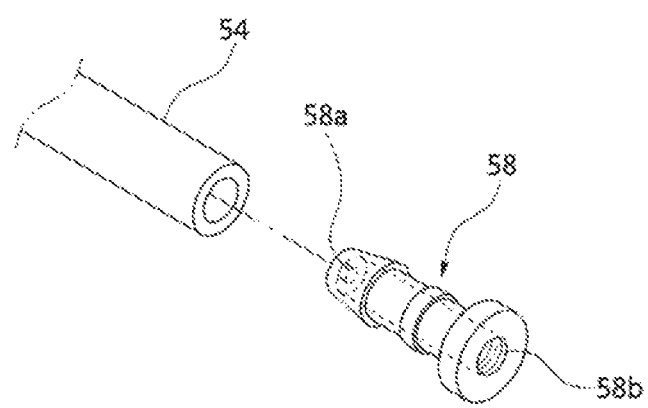

[FIG. 8A]
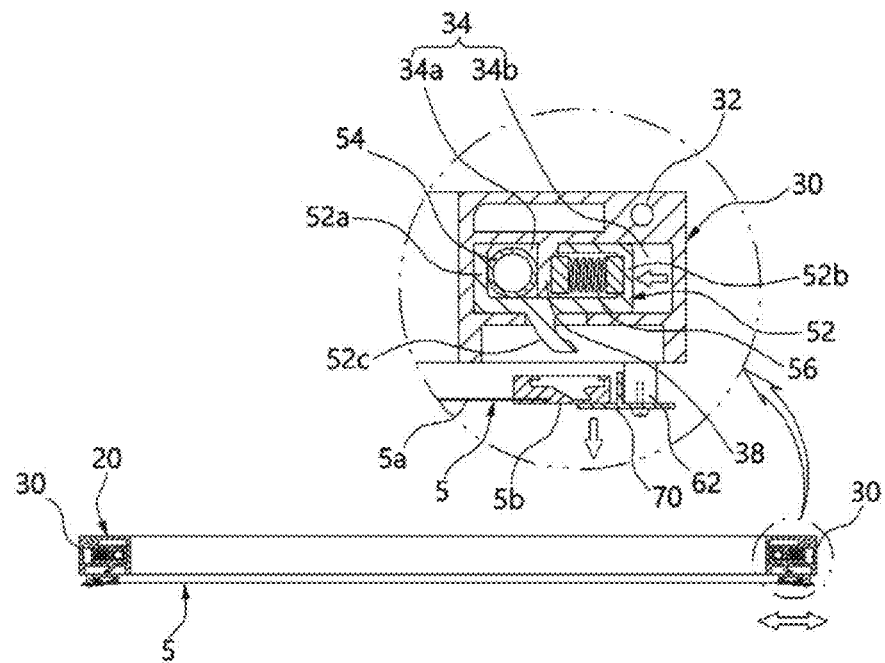
[FIG. 8B]
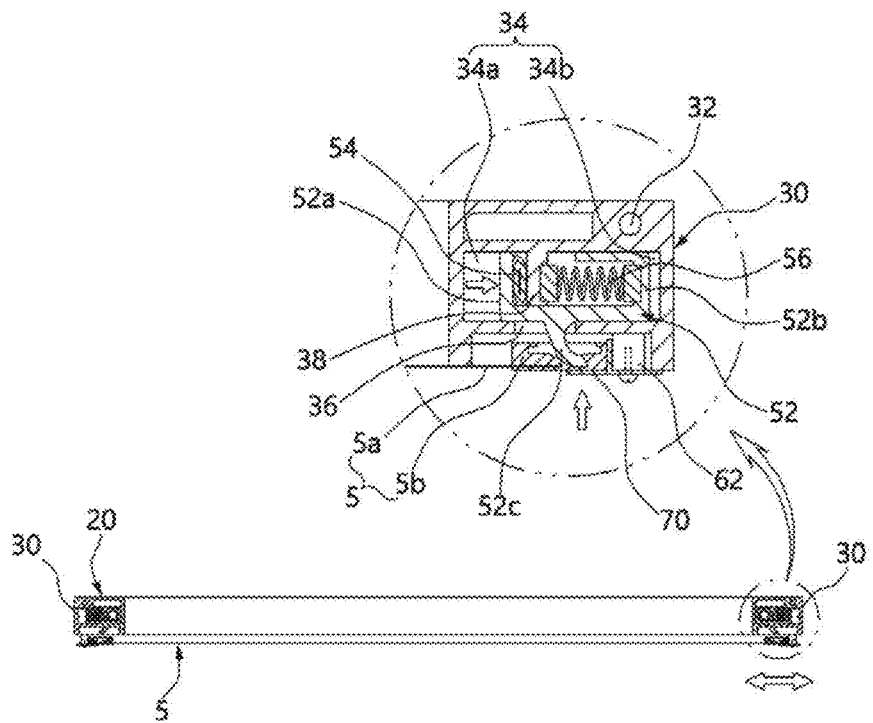

[FIG. 9A]
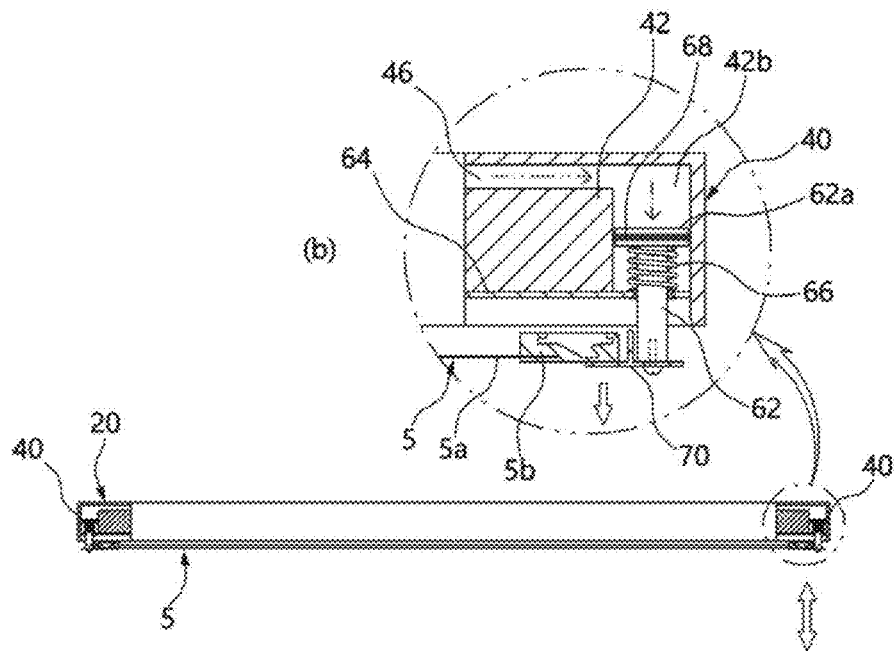
[FIG. 9B]
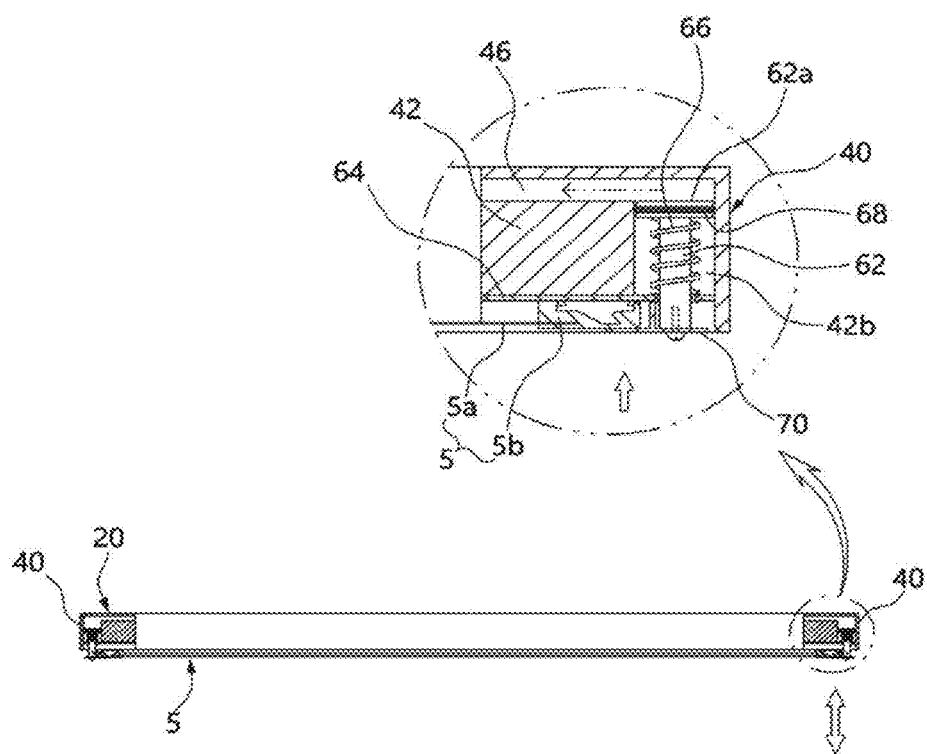

[FIG. 10]
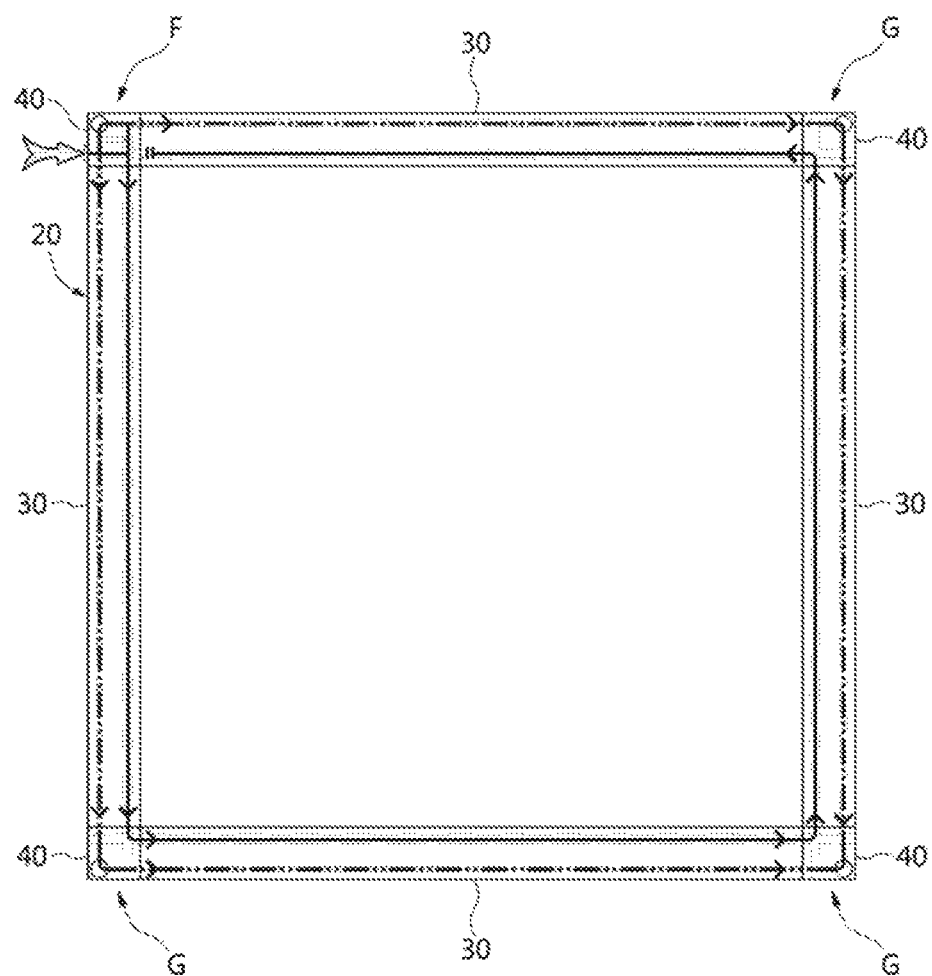

[FIG. 11A]
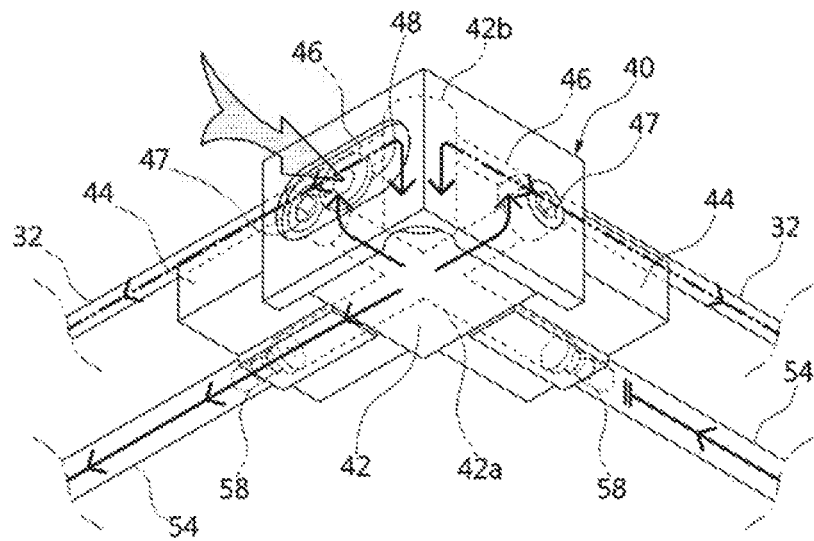
[FIG. 11B]
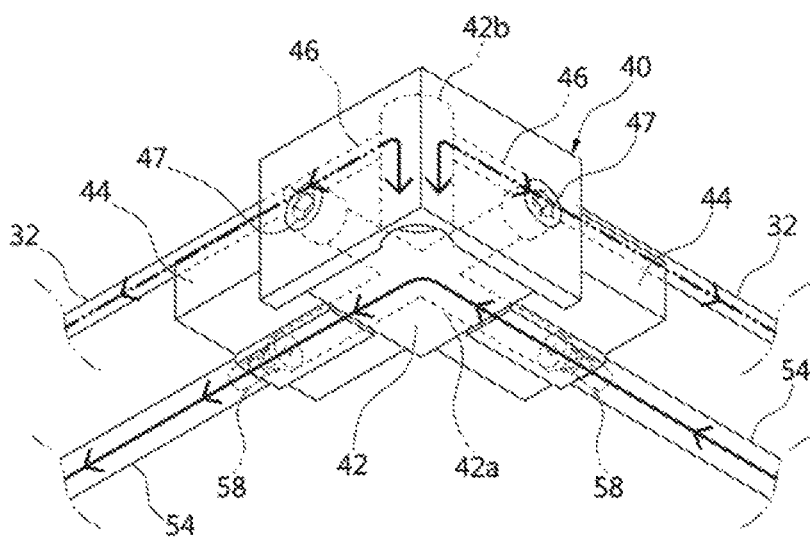

PRINTING SCREEN FRAME HOLDING DEVICE

RELATED APPLICATIONS

This, application is a U.S. National Stage filing under 35 U.S.C. § 371 of PCT Application No. PCT/KR2016/015220, filed Dec. 23 2016, which claims priority to Korean Application No. 10-2016-0052257 filed Apr. 28, 2016, which applications are incorporated herein by reference in their entirety, for any purpose.

TECHNICAL FIELD

The present invention relates generally to a printing screen frame holding device. More particularly, the present invention relates to a printing screen frame holding device configured such that a lifting and lowering operation portion and a tensioning operation portion are successively operated at an interval of few seconds by means of control of a rate of supply of air pressure by an orifice, causing a printing screen unit to be attached and detached (replaced) and tensioned simultaneously.

BACKGROUND ART

In general, a printing screen unit includes a rectangular printing screen having printing hole patterns formed therein, first and second pairs of interface portions fitted and attached to the printing screen by means of connecting members to face two pairs of opposite edges of the printing screen, respectively, and a support frame having first to fourth corner pieces connecting the respective interface units to each other.

Herein, the printing screen is widely used in semiconductor manufacturing technology, and is a metal thin film which is used for applying a solder cream for mounting a chip or the like on a printed circuit board in surface-mount technology or is used for photolithography.

The printing screen, which is also referred to a metal mask or a stencil mask, has fine printing holes perforated therein according to predetermined patterns. The printing screen is mounted and used in equipment such as a screen printer, photolithographic equipment, cleaning equipment, and the like and is replaced frequently when other patterns are required.

Though the printing screen is used in a state of being attached to the support frame, if a loose portion is present, the printing patterns are shifted when the printing screen is scratched by a squeegee or the printing patterns are distorted. In order to prevent such a situation, when screen printing is performed, a tensile force is required to be applied to the printing screen to always exert a predetermined tensile force to the printing screen. Additionally, an attachable/detachable function is also required such that the printing screen is replaced frequently when other patterns are required therefor.

In other words, the printing screen is mounted on equipment such as a screen printer for a printed circuit board by means of the support frame, and is required to be periodically replaced and cleaned. Thus, a holding device, which is provided with a lifting and lowering operation portion requiring the attachable/detachable function and a tensioning operation portion requiring the tensile force, is an important factor.

Regarding such a holding device, a printing screen frame holding device is disclosed in Korean Patent Application Publication No. 2015-0131494 (Nov. 25, 2015). As shown in FIGS. 1 to 4, the device is configured such that a printing screen unit 5 is replaced or tensioned by a frame holding means 1 of square or rectangular frame shape, the frame holding means being manufactured by using a mounting frame 3 having a U-shaped cross section by welding or bolting.

In other words, the printing screen unit 5 is tensioned tight and used in a state of being mounted to the frame holding means 1. To this end, the frame holding means 1 is provided with a tensioning mechanism 2 for tensioning a printing screen 5a in all directions.

The tensioning mechanism 2 is provided at each side of the frame holding means 1 and includes a tensioning bar 4 mounted so as to be movable forward and backward with respect to a center of the frame holding means 1, a coil spring 6 having one end supported by an inner wall 3a of the mounting frame 3 and the other end supported by the tensioning bar 4 such that the tensioning bar 4 is elastically supported to the outside of the frame holding means 1, and a pneumatic portion opening a valve in response to an applied signal to transmit air pressure, such that the tensioning bar 4 is caused to overcome an elastic force of the coil spring 6 acting thereon and thus is moved to the center of the frame holding means 1.

The tensioning bar 4 has a hook plate 10 inclined screwed to a front end thereof such that the hook plate hooks and pulls a support frame 5b of the printing screen unit 5 by using the support frame as a locking step 8.

Furthermore, lifting and lowering plates 9 are mounted at sides of the rectangular frame holding means 1 so as to be lifted or lowered such that the printing screen unit 5 is allowed to be replaced, the lifting and lowering plates being respectively mounted on lower surfaces of auxiliary supports 7 at opposite left and right sides of the frame holding means, and lifting and lowering cylinders 11 mounted in each of the auxiliary supports 7 so as to operate each of the lifting and lowering plates 9, the lifting and lowering cylinders 11 being respectively mounted at left and right ends of the auxiliary support 7 for left and right balance.

Herein, the lifting and lowering plate 9 has rail forming plates 13 directly connected to piston rods 11a of the lifting and lowering cylinders 11 and mounted on a lower surface of the lifting and lowering plate 9 so as to support opposite sides of the support frame 5b with respect to the printing screen unit 5.

However, the printing screen frame holding device in the related art constructed as described above is problematic in that the auxiliary supports 7, which are provided as the lifting and lowering operation portion for replacing (attaching and detaching) the printing screen unit 5 from the frame holding means 1, are additionally mounted on the outside of the mounting frame 3 at opposite left and right sides thereof, and thus an inner peripheral area of the mounting frame 3 decreases by the widths of the auxiliary supports 7, leading to a reduction in a printing area and a remarkable reduction in usability due to frequent replacement.

Furthermore, separate pneumatic portions (an assembly comprised of a speed valve, a feeder, a solenoid, a tube, and the like) for operating the lifting and lowering cylinders 11 are additionally provided to the pneumatic portion of the tensioning mechanism 2, and the auxiliary supports 7 are additionally provided. This requires a complicated operation when the printing screen unit 5 is replaced and thus may cause an erroneous operation to occur. Additionally, an increase in volume and weight may make it difficult for the printing screen unit to be mounted and cause an increase in manufacturing costs.

DISCLOSURE

Technical Problem

Accordingly, the present invention has been made keeping in mind the above problems occurring in the related art, and an objective of the present invention is to provide a printing screen frame holding device that structurally integrates a lifting and lowering operation portion and a tensioning operation portion of a frame holding means without provision of any separate mechanism and an additional component such that the lifting and lowering operation portion and the tensioning operation portion are successively operated at an interval of few seconds by means of control of a rate of supply of air pressure by an orifice, causing the frame holding means to be minimized in volume and weight. Furthermore, the present invention maximizes a printing area of a printing screen and does not require replacement of the frame holding means. Furthermore, the present invention simplifies operation when a printing screen unit is attached and detached (replaced), minimizes an erroneous operation, and achieves a reduction in volume and weight, and thus facilitates mounting and reduces manufacturing costs.

Technical Solution

In order to accomplish the above objective, according to an aspect of the present invention, there is provided a printing screen frame holding device that is configured such that a printing screen unit is replaced or tensioned by a quadrangular flame-shaped frame holding means by using multiple mounting frames and multiple corner pieces and includes:

the multiple mounting frames each including an air pressure supply hole formed at an upper portion of a cross section thereof by extending along a longitudinal direction thereof, a cavity formed at a central portion of the cross section thereof by extending along the longitudinal direction thereof, a tensioning operation portion provided in the cavity, the tensioning operation portion being slid horizontally to be disengaged from an edge of the printing screen unit when a tube expands due to air pressure and being slid horizontally to be engaged to the edge of the printing screen unit by an elastic force acting thereon when the air pressure is released, and a tube sleeve force-fitted into opposite ends of the tube and causing the air pressure supplied to the tube to be lower than the air pressure supplied to the air pressure supply hole in rate of supply, the tube sleeve pulling the tube when the tube is replaced; and the multiple corner pieces each including a body, hollow insert protrusions centrally protruding from inside surfaces of the body, respectively, the hollow insert protrusions facing and being inserted into the cavities of ends of the mounting frames orthogonally positioned in two directions such that the tubes and a lower cavity defined in the body communicate with each other, communication holes formed on upper portions of the inside surfaces of the body, respectively, the communication holes facing and being connected to the air pressure supply holes of the ends of the mounting frames orthogonally positioned in two directions such that the communication holes and an upper cavity defined in the body communicate with each other, and a lifting and lowering operation portion provided at a lower surface of the body and having an upper end inserted into the upper cavity, the lifting and lowering operation portion being lowered by the air pressure or lifted by the elastic force when the air pressure is released.

In an embodiment of the present invention, the cavity may include: an operation guide hole centrally formed on a bottom surface thereof by extending along the longitudinal direction of the mounting frame; an isolation wall centrally extending downward from a top surface thereof to be spaced apart at a lower end thereof from the bottom surface of the cavity, the isolation wall extending along the longitudinal direction of the mounting frame and being positioned at a center of the operation guide hole so as to allow the operation guide hole to be divided into an inner cavity and an outer cavity; and the tensioning operation portion provided across the inner cavity and the outer cavity, wherein the tensioning operation portion may include: multiple tensioning members each having opposite side protrusions respectively positioned in the inner cavity and the outer cavity with the isolation wall interposed therebetween, and having a lower engaging protrusion protruding from a lower surface thereof through the operation guide hole, the tensioning members being slidable in a horizontal direction to be engaged to or disengaged from a support frame of the printing screen unit; the tube positioned between the side protrusion of the tensioning member and the isolation wall and causing the tensioning member to be slid to the inner cavity when expanding by the air pressure, thereby releasing a tensile force; an elastic member positioned between the side protrusion of the tensioning member and the isolation wall and causing the tensioning member to be slid to the outer cavity by the elastic force acting thereon when the air pressure is released, thereby applying the tensile force; and the tube sleeve force-fitted into the opposite ends of the tube and causing the air pressure supplied to the tube to be lower than the air pressure supplied to the air pressure supply hole in rate of supply, the tube sleeve pulling the tube when the tube is replaced.

In an embodiment of the present invention, the tube sleeve may have an orifice hole formed at an inside surface end thereof to become narrow such that the air pressure supplied to the tube is lower than the air pressure supplied to the air pressure supply hole in rate of supply, and a screw hole formed at an outside surface end thereof and screwed with a separate tool such that the tube sleeve is pulled together with the tube.

In an embodiment of the present invention, the body may have check holes formed on outside surfaces thereof, respectively, to correspond straight to the tube sleeves through the lower cavity and the hollow insert protrusions orthogonally extending in two directions, the check holes each having a cap opened and closed by means of a screw-type engagement.

In an embodiment of the present invention, any one of the bodies of the multiple corner pieces may be provided with an injection port through which the air pressure is simultaneously supplied to the lower cavity and the upper cavity.

In an embodiment of the present invention, the lifting and lowering operation portion may include: a piston rod having a lifting and lowering plate secured to an upper end thereof such that the piston rod is inserted at an upper portion thereof into the upper cavity through the lower surface of the body of the corner piece to be lifted and lowered; a cover plate guiding the piston rod to be lifted and lowered while passing therethrough and closely secured to the lower surface of the body to seal a lower opening of the upper cavity; a coil spring fitted over an outer peripheral surface of the piston rod at a position between the lifting and lowering plate and the cover plate and accommodated in the upper cavity, the coil spring applying the elastic force acting to lift the piston rod; an O-ring fitted on an outer peripheral surface of the lifting and lowering plate and moved in close contact with an inner peripheral surface of the upper cavity, and a pair of left and right rail forming plates coupled to a lower surface of the piston rod and supporting opposite sides of the printing screen unit.

Advantageous Effects

According to the printing screen frame holding device according to the present invention, both the tensioning operation portions and the lifting and lowering operation portions, which are successively operated at intervals of several seconds by means of control of the rate of supply of air pressure by an orifice, are mounted on the quadrangular frame-shaped frame holding means that includes a combination of the multiple mounting frames and the multiple corner pieces, without provision of any separate mechanism or an additional component. Because of this, an inner peripheral area of the mounting frames is not reduced by the width of auxiliary supports as in the related art, making it possible to maximize the printing area of the printing screen, and making it unnecessary to replace the frame holding means. Furthermore, it is not necessary to additionally provide an assembly comprised of an auxiliary support, a lifting and lowering cylinder, a speed valve, a feeder, a solenoid, a tube, and the like for separately operating the lifting and lowering operation portion as in the related art. Furthermore, it is possible to simplify operation when the printing screen unit is attached and detached (replaced), thereby minimizing an erroneous operation, and to achieve a reduction in volume and weight, thereby facilitating mounting and reducing manufacturing costs.

Furthermore, according to the printing screen frame holding device according to the present invention, the tube sleeve, which is force-fitted to the end of the tube, is structured to be easily removed externally by means of the check hole provided in the corner piece, making it possible to enable easy replacement of the tube when the tube is broken without disassembling the frame holding means.

DESCRIPTION OF DRAWINGS

FIG. 1 is an exploded perspective view showing a printing screen frame holding device in the related art.

FIG. 2 is an assembled perspective view showing a state in which a printing screen is mounted on the printing screen frame holding device in the related art.

FIG. 3A is a longitudinal sectional view showing a tensioning operation portion taken along line A-A of FIG. 2.

FIG. 3B is a longitudinal sectional view showing a tensioning operation portion taken along line A-A of FIG. 2.

FIG. 4A is a cross-sectional view showing a lifting operation portion taken along line B-B of FIG. 2.

FIG. 4B is a cross-sectional view showing a lowering operation portion taken along line B-B of FIG. 2.

FIG. 5 is an assembled perspective view showing a state in which a printing screen is mounted on a printing screen frame holding device according to the present invention.

FIG. 6 is an exploded perspective view showing an enlarged view of a portion C in FIG. 5.

FIG. 7 is an exploded perspective view showing a tube and a tube sleeve according to the present invention.

FIG. 8A shows a cross-sectional view of a tensioning operation portion taken along line D-D of FIG. 5.

FIG. 8B shows a cross-sectional view of a tensioning operation portion taken along line D-D of FIG. 5.

FIG. 9A shows a longitudinal sectional view of a lifting operation portion taken along line E-E of FIG. 5.

FIG. 9B shows a longitudinal sectional view of a lowering operation portion taken along line E-E of FIG. 5.

FIG. 10 is a bottom view showing a direction of air flow supplied to the lifting and lowering operation portion and the tensioning operation portion of the printing screen frame holding device by means of air pressure by an orifice according to the present invention.

11A is a partial perspective view showing an air flow in a corner piece through an injection port with respect to a section F of FIG. 10.

FIG. 11B is a partial perspective view showing an air flow in the corner piece with respect to a section G of FIG. 10.

<Description of the Reference Numerals in the Drawings>

5: printing screen unit
5a: printing screen
5b: support frame
20: frame holding means
30: mounting frame
32: air pressure supply hole
34: cavity
34a: inner cavity
34b: outer cavity
36: operation guide hole
38: isolation wall
40: corner piece
42: body
42a: lower cavity
42b: upper cavity
42c: check hole
44: hollow insert protrusion
46: communication hole
47: cap
48: injection port
50: tensioning operation portion
52: tensioning member
52a, 52b: side protrusion
52c: engaging protrusion
54: tube
56: elastic member
58: tube sleeve
58a: orifice hole
58b: screw hole
60: lifting and lowering operation portion
62: piston rod
62a: lifting and lowering plate
64: cover plate
66: coil spring
68: O-ring
70: rail forming plate

BEST MODE

Hereinafter, exemplary embodiment of the present invention will be described in detail with reference to FIG. 5 to FIGS. 11a and 11b.

The printing screen frame holding device according to the present invention is configured such that a printing screen unit 5 is replaced or tensioned by a quadrangular frame-shaped frame holding means 20 by using multiple mounting frames 30 and multiple corner pieces 40.

In other words, the multiple mounting frames 30 are constructed from an aluminum material by extrusion molding to have a predetermined length, each of the mounting frames having an air pressure supply hole 32 formed at an upper portion of a cross section thereof by extending along a longitudinal direction thereof and a cavity 34 formed at a central portion of the cross section thereof by extending along the longitudinal direction thereof.

Herein, the cavity 34 is formed in a rectangular shape having a larger lateral width than a vertical height, the cavity including an operation guide hole 36 centrally formed on a bottom surface thereof by extending along the longitudinal direction of the mounting frame 30, an isolation wall 38 centrally extending downward from a top surface thereof to be spaced apart at a lower end thereof from the bottom surface of the cavity 34, the isolation wall extending along the longitudinal direction of the mounting frame 30 and being positioned at a center of the operation guide hole 36 so as to allow the operation guide hole to be divided into an inner cavity 34*a* and an outer cavity 34*b*, and a tensioning operation portion 50 provided across the inner cavity 34*a* and the outer cavity 34*b*.

The tensioning operation portion 50 includes: multiple tensioning members 52 each having opposite side protrusions 52*a* and 52*b* respectively positioned in the inner cavity 34*a* and the outer cavity 34*b* with the isolation wall 38 interposed therebetween, and having a lower engaging protrusion 52*c* protruding from a lower surface thereof through the operation guide hole 36, the tensioning members being slidable in a horizontal direction to be engaged to or disengaged from a support frame 5*b* of the printing screen unit 5; a tube 54 positioned between the side protrusion 52*a* of the tensioning member 52 and the isolation wall 38 and causing the tensioning member 52 to be slid into the inner cavity 34*a* when expanding by air pressure, thereby releasing a tensile force; an elastic member 56 positioned between the side protrusion 52*b* of the tensioning member 52 and the isolation wall 38 and causing the tensioning member 52 to be slid to the outer cavity 34*b* by an elastic force acting thereon when the air pressure is released, thereby applying the tensile force; and a tube sleeve 58 force-fitted into opposite ends of the tube 54 and causing the air pressure supplied to the tube 54 to be lower than the air pressure supplied to the air pressure supply hole 32 in rate of supply, the tube sleeve pulling the tube 54 when the tube is replaced.

Herein, the tube sleeve 58 is constructed from a brass material, and has an orifice hole 58*a* formed at an inside surface end thereof to become narrow such that air pressure supplied to the tube 54 is lower than air pressure supplied to the air pressure supply hole 32 in rate of supply, and a screw hole 58*b* formed at an outside surface end thereof and screwed with a separate tool such that the tube sleeve is pulled together with the tube 54.

The multiple corner pieces 40 are constructed from an aluminum material, each of the corner pieces being formed to extend orthogonally in two directions by die casting and includes: a body 42; hollow insert protrusions 44 centrally protruding from inside surfaces of the body, respectively, the hollow insert protrusions facing and being inserted into the cavities 34 of ends of the mounting frames 30 orthogonally positioned in two directions such that the tubes 53 and a lower cavity 42*a* defined in the body 42 communicate with each other, communication holes 46 formed on upper portions of the inside surfaces of the body 42, respectively, the communication holes facing and being connected to the air pressure supply holes 32 of the ends of the mounting frames 30 orthogonally positioned in two directions such that the communication holes and an upper cavity 42*b* defined in the body 42 communicate with each other, and a lifting and lowering operation portion 60 provided at a lower surface of the body 42 and having an upper end inserted into the upper cavity 42*b*, the lifting and lowering operation portion being lowered by air pressure or lifted by the elastic force when the air pressure is released.

Herein, the body 42 has check holes 42*c* formed on outside surfaces thereof respectively, to correspond straight to the tube sleeves 58 through the lower cavity 42*a* and the hollow insert protrusions 44 orthogonally extending in two directions, the check holes 42*c* each having a cap 47 opened and closed by means of a screw-type engagement. One of the bodies 42 is provided with an injection port 48 connected to a separate air supply means such that air pressure is simultaneously supplied to the lower cavity 42*a* and the upper cavity 42*b* therethrough.

The lifting and lowering operation portion 60 includes: a piston rod 62 having a lifting and lowering plate 62*a* secured to an upper end thereof such that the piston rod is inserted at an upper portion thereof into the upper cavity 42*b* through the lower surface of the body 42 of the corner piece 40 to be lifted and lowered; a cover plate 64 guiding the piston rod 62 to be lifted and lowered while passing therethrough and closely secured to the lower surface of the body 42 to seal a lower opening of the upper cavity 42*b*; a coil spring 66 fitted over an outer peripheral surface of the piston rod 62 at a position between the lifting and lowering plate 62*a* and the cover plate 64 and accommodated in the upper cavity 42*b*, the coil spring applying the elastic force acting to lift the piston rod 62; an O-ring 68 fitted on an outer peripheral surface of the lifting and lowering plate 62*a* and moved in close contact with an inner peripheral surface of the upper cavity 42*b*; and a pair of left and right rail forming plates 70 coupled to a lower surface of the piston rod 62 and supporting opposite sides of the support frame 5*b* of the screen unit 5.

Hereinafter, the operation and effect of printing screen frame holding device according to the present invention having the above configuration will be described.

The printing screen frame holding device according to the present invention is characterized in that, when the air is injected through the injection port 48 of an end of the quadrangular frame-shaped frame holding means 20 that is comprised of the multiple mounting frames 30 and multiple corner pieces 40, without provision of any separate mechanism or an additional component, the lifting and lowering operation portions 60 and the tensioning operation portions 50 are successively operated at intervals of several seconds by means of control of a rate of supply of air pressure by an orifice. This causes the printing screen unit 5 to be lifted so as to be supported at an edge thereof while the printing screen 5*a* is caused to be tensioned by the tensile force acting thereon in all directions through engagement with the edge of the printing screen unit 5.

In other words, as shown in FIG. 10, FIG. 11*a*, and FIG. 11*b*, high-pressure air is supplied externally from the separate air supply means through the injection port 48 provided at the body 42 of the F-section side corner piece 40 of the frame holding means 20, air pressure is simultaneously supplied to the lower cavity 42*a* and the upper cavity 42*b* of the body 42 that communicate with each other only in a F section, and thus flows from a start tube 54 of the tubes in a F section only in one direction (for example, in a counterclockwise direction) along a flow line indicated by a solid line arrow. Furthermore, air pressure is divided in the F section and parts of the divided air pressure flow in two directions (for example, in the counterclockwise direction and a clockwise direction) along a flow line indicated by a two-dot chain line arrow through the air pressure holes 32 of the mounting frames 30 that communicate with two communication holes 46 orthogonally formed in two directions in the body 42 of the corner piece 40.

Herein, among the multiple corner pieces 40, air pressure flowing along the solid line arrow and air pressure flowing along the two-dot chain line arrow through G sections are not mixed together. This makes it possible control of the speed at which the tensioning operation portions 50 are moved in directions in which the tension is released due to expansion of the tubes 54 as shown in FIG. 8b and control of the speed at which the lifting and lowering operation portions 60 are moved downward as shown in FIG. 9b are performed simultaneously at intervals of several seconds.

In other words, the flow of air pressure flowing in only one direction along the tubes 54 is reduced when passing through the orifice holes 58a of the tube sleeves 58 fitted into the tubes 54, causing the tubes 54 to expand, whereby the a required amount of air pressure (1,200 cc) for operating the tensioning operation portions 50 in the directions in which the tension is released is gradually filled for three seconds, for example. Meanwhile, air pressure flowing in two directions through the communication holes 46 formed along the quadrangular frame-shaped frame holding means 20 and through the air pressure supply holes 32 quickly reaches the upper cavities 42b defined in the bodies 42 of the multiple corner pieces 40, whereby a required amount of air pressure (100 cc) for operating the lifting and lowering operation portions 60 to be moved downward is quickly filled for 0.3 seconds, for example.

Accordingly, as shown by the arrows indicated in FIG. 10, when air pressure is supplied through the injection port 48 in the section F, the air pressure, which flows in only one direction (in the counterclockwise direction) along the flow line of the solid line arrow through the tubes 54 provided in the quadrangular frame-shaped frame holding means 20, is interfered with by the orifice holes 58a formed in the tube sleeves 58 and thus is supplied to the tensioning operation portions 50 at a low rate. Meanwhile, the air pressure, which flows in two directions (in the counterclockwise direction and the clockwise direction) along the flow line of the two-dot chain line arrow through the air pressure supply holes 32 formed in the quadrangular frame-shaped frame holding means 20, is supplied to the lifting and lowering operation portions 60 at a high rate. Thus, the lifting and lowering operation portions are faster in operating speed than the tensioning operation portions. Because of this, it is not necessary to additionally provide an assembly comprised of an auxiliary support, a lifting and lowering cylinder, a speed valve, a feeder, a solenoid, a tube, and the like for separately operating the lilting and lowering operation portion as in the related art. Furthermore, it is possible to simplify operation when the printing screen unit 5 is attached and detached (replaced), thereby minimizing an erroneous operation, and to achieve a reduction in volume and weight, thereby facilitating mounting and reducing manufacturing costs.

Furthermore, both the tensioning operation portions 50 and the lifting and lowering operation portions 60, which are successively operated at intervals of several seconds by means of control of the rate of supply of air pressure by an orifice, are mounted on the quadrangular frame-shaped frame holding means 20 that includes a combination of the multiple mounting frames 20 and the multiple corner pieces 40, without provision of any separate mechanism or an additional component. Because of this, an inner peripheral area of the mounting frames 30 is not reduced by the width of auxiliary supports as in the related art, making it possible to maximize a printing area of the printing screen 5a, and making it unnecessary to replace the frame holding means 20.

Furthermore, the tube sleeve 58, which is force-fitted to the end of the tube 54, functions not only as an orifice, but also functions to enable easy replacement of the tube 54 when the tube is broken without disassembling the frame holding means 20.

In other words, as shown in FIGS. 11a and 11b, the tube sleeve 58 force-fitted to the end of the tube 54 is provided to correspond straight to the check hole 42c formed on the outer surface of the body 42 of the corner piece 40. Because of this, when the cap 47 screwed to the check hole 42c is removed therefrom and then a separate tool is inserted through the check hole 42c to be fastened to the screw hole 58b of the tube sleeve 58, the tube is caused to be easily pulled out.

Meanwhile, as shown in FIG. 8a, when supply of air pressure to the frame holding means 20 is stopped, air pressure in the tubes 54 of the tensioning operation portions 50 are caused to be released. Because of this, the elastic members 56 in a compressed state expand to compress the tubes 54 while causing the tensioning members 52 to be slid to be horizontally moved from the inner cavities 34a to the outer cavities 34b of the mounting frames 30. Accordingly, the engaging protrusions 52c of the tensioning members 52 are locked and engaged to a locking step of the support frame 5b of the printing screen unit 5, resulting in the printing screen 5a being tensioned tight by the tensile force acting thereon in all directions.

Additionally, as shown in FIG. 9a, when supply of air pressure to the frame holding means 20 is stopped, air pressure in the upper cavities 42b of the bodies 42 of the corner pieces 40 provided with the lifting and lowering operation portions 60 is released. Because of this, the coil springs 66 in a compressed state expand to cause the piston rods 62 of the lifting and lowering operation portions 60 to be lifted. Accordingly, the pair of left and right rail forming plates 70 coupled to the lower surfaces of the piston rods 62 is caused to be simultaneously pulled upward while the printing screen unit 5 seated on upper surfaces of the rail forming plates 70 with the edge locked thereto is caused to be pulled upward. This causes the support frame 5b of the printing screen unit 5 to be engaged to the engaging protrusions 52c of the tensioning operation portions 50 described above.

Although a preferred embodiment of the present invention has been described for illustrative purposes, those skilled in the art will appreciate that various modifications, additions and substitutions are possible, without departing from the scope and spirit of the invention as disclosed in the accompanying claims. Accordingly, the present invention is intended to cover not only the exemplary embodiments, but also various alternatives, modifications, equivalents and other embodiments that may be included within the spirit and scope of the present invention as defined by the appended claims.

The invention claimed is:

1. A printing screen frame holding device configured such that a printing screen unit is replaced or tensioned by a quadrangular frame-shaped frame holding means by using multiple mounting frames and multiple corner pieces, the printing screen frame holding device comprising:

the multiple mounting frames each including an air pressure supply hole formed at an upper portion of a cross section thereof by extending along a longitudinal direction thereof, a cavity formed at a central portion of the cross section thereof by extending along the longitudinal direction thereof, a tensioning operation portion provided in the cavity, the tensioning operation portion being slid horizontally to be disengaged from an edge of the printing screen unit when a tube expands due to air pressure and being slid horizontally to be engaged to the edge of the printing screen unit by an elastic force acting thereon when the air pressure is released, and a tube sleeve force-fitted into opposite ends of the tube and causing the air pressure supplied to the tube to be lower than the air pressure supplied to the air pressure supply hole in rate of supply, the tube sleeve pulling the tube when the tube is replaced; and the multiple corner pieces each including a body and hollow insert protrusions centrally protruding from inside surfaces of the body, respectively, the hollow insert protrusions facing and being inserted into the cavities of ends of the mounting frames orthogonally positioned in two directions such that the tubes and a lower cavity defined in the body communicate with each other, communication holes formed on upper portions of the inside surfaces of the body, respectively, the communication holes facing and being connected to the air pressure supply holes of the ends of the mounting frames orthogonally positioned in two directions such that the communication holes and an upper cavity defined in the body communicate with each other, and a lifting and lowering operation portion provided at a lower surface of the body and having an upper end inserted into the upper cavity, the lifting and lowering operation portion being lowered by the air pressure or lifted by the elastic force when the air pressure is released.

2. The printing screen frame holding device of claim 1, wherein the cavity includes:

an operation guide hole centrally formed on a bottom surface thereof by extending along the longitudinal direction of the mounting frame;

an isolation wall centrally extending downward from a top surface thereof to be spaced apart at a lower end thereof from the bottom surface of the cavity, the isolation wall extending along the longitudinal direction of the mounting frame and being positioned at a center of the operation guide hole so as to allow the operation guide hole to be divided into an inner cavity and an outer cavity; and the tensioning operation portion provided across the inner cavity and the outer cavity, wherein the tensioning operation portion includes:

multiple tensioning members each having opposite side protrusions respectively positioned in the inner cavity and the outer cavity with the isolation wall interposed therebetween, and having a lower engaging protrusion protruding from a lower surface thereof through the operation guide hole, the tensioning members being slidable in a horizontal direction to be engaged to or disengaged from a support frame of the printing screen unit;

the tube positioned between the side protrusion of the tensioning member and the isolation wall and causing the tensioning member to be slid to the inner cavity when expanding by the air pressure, thereby releasing a tensile force;

an elastic member positioned between the side protrusion of the tensioning member and the isolation wall and causing the tensioning member to be slid to the outer cavity by the elastic force acting thereon when the air pressure is released, thereby applying the tensile force; and the tube sleeve force-fitted into the opposite ends of the tube and causing the air pressure supplied to the tube to be lower than the air pressure supplied to the air pressure supply hole in rate of supply, the tube sleeve pulling the tube when the tube is replaced.

3. The printing screen frame holding device of claim 1, wherein the tube sleeve has an orifice hole formed at an inside surface end thereof to become narrow such that the air pressure supplied to the tube is lower than the air pressure supplied to the air pressure supply hole in rate of supply, and a screw hole formed at an outside surface end thereof and screwed with a separate tool such that the tube sleeve is pulled together with the tube.

4. The printing screen frame holding device of claim 1, wherein the body has check holes formed on outside surfaces thereof, respectively, to correspond straight to the tube sleeves through the lower cavity and the hollow insert protrusions orthogonally extending in two directions, the check holes each having a cap opened and closed by means of a screw-type engagement.

5. The printing screen frame holding device of claim 1, wherein any one of the bodies of the multiple corner pieces is provided with an injection port through which the air pressure is simultaneously supplied to the lower cavity and the upper cavity.

6. The printing screen frame holding device of claim 1, wherein the lifting and lowering operation portion includes:

a piston rod having a lifting and lowering plate secured to an upper end thereof such that the piston rod is inserted at an upper portion thereof into the upper cavity through the lower surface of the body of the corner piece to be lifted and lowered;

a cover plate guiding the piston rod to be lifted and lowered while passing therethrough and closely secured to the lower surface of the body to seal a lower opening of the upper cavity;

a coil spring fitted over an outer peripheral surface of the piston rod at a position between the lifting and lowering plate and the cover plate and accommodated in the upper cavity, the coil spring applying the elastic force acting to lift the piston rod;

an O-ring fitted on an outer peripheral surface of the lifting and lowering plate and moved in close contact with an inner peripheral surface of the upper cavity; and a pair of left and right rail forming plates coupled to a lower surface of the piston rod and supporting opposite sides of the printing screen unit.

\* \* \* \* \*